United States Patent
Huth et al.

(10) Patent No.: US 6,901,544 B1
(45) Date of Patent: May 31, 2005

(54) SCAN CHAIN TESTING OF INTEGRATED CIRCUITS WITH HARD-CORES

(75) Inventors: Joerg Huth, Unterfoehring (DE); Andreas Hils, Unterhaching (DE)

(73) Assignee: LSI Logic Corporation, Milpitas, CA (US)

( * ) Notice: Subject to any disclaimer, the term of this patent is extended or adjusted under 35 U.S.C. 154(b) by 525 days.

(21) Appl. No.: 10/000,597

(22) Filed: Oct. 24, 2001

(51) Int. Cl.[7] .................................................. G01R 31/28
(52) U.S. Cl. ........................ 714/731; 714/727; 714/729
(58) Field of Search ................................. 714/726, 727, 714/729, 731, 724, 30; 716/2

(56) References Cited

U.S. PATENT DOCUMENTS

| | | | | |
|---|---|---|---|---|
| 4,893,072 A | * | 1/1990 | Matsumoto | 714/731 |
| 5,642,362 A | * | 6/1997 | Savir | 714/726 |
| 5,828,579 A | * | 10/1998 | Beausang | 716/2 |
| 6,381,719 B1 | * | 4/2002 | Scheck | 714/727 |
| 6,446,229 B1 | * | 9/2002 | Merrick et al. | 714/724 |
| 6,539,497 B2 | * | 3/2003 | Swoboda et al. | 714/30 |

* cited by examiner

*Primary Examiner*—David Ton
(74) *Attorney, Agent, or Firm*—Christopher P. Maiorana, P.C.

(57) ABSTRACT

The invention relates to an integrated circuit including a hard-core and a peripheral circuit. The hard-core and the peripheral circuit each include respective registers, which are couplable for scan chain testing by respective scan chain paths within the core and within the peripheral circuit. In order to avoid timing problems between the two scan chain paths, a lock-up latch is provided within the hard-core. The lock-up latch has an input coupled to the last register in the scan chain path within the hard-core, and an output coupled to the first register in the scan chain path in the peripheral circuit. The lock-up latch forms part of the hard-core and is clocked by the same clock signal as the last register in the hard-core scan chain path.

20 Claims, 3 Drawing Sheets

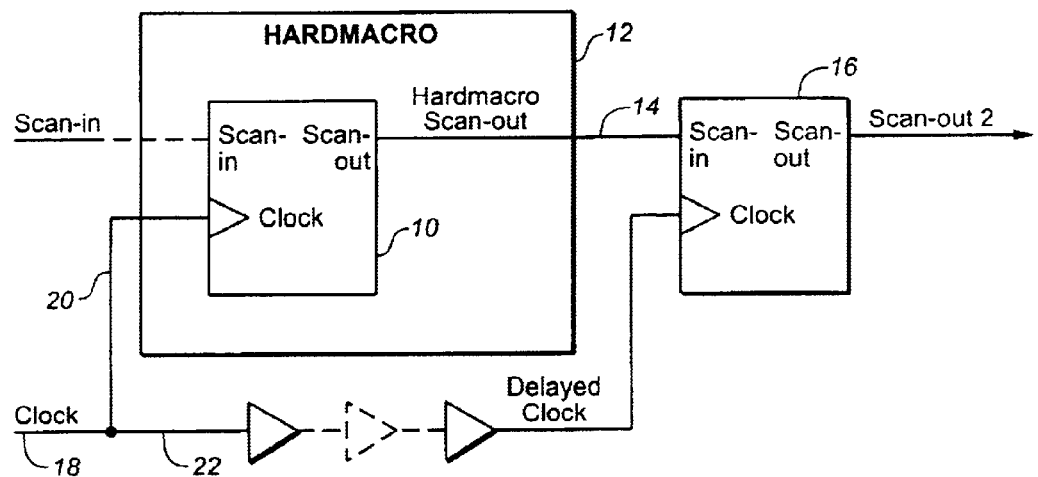
FIG._1
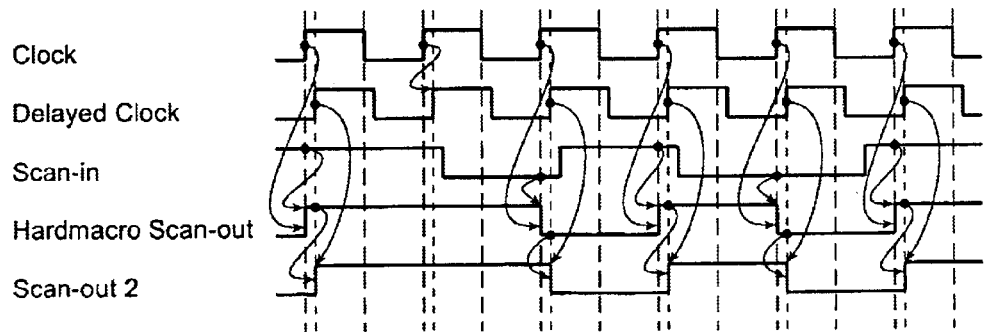
FIG._2
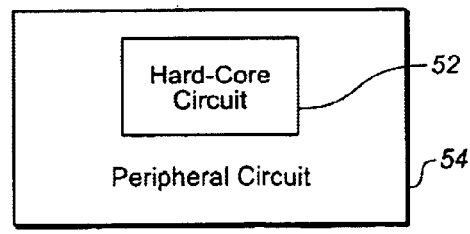
FIG._3

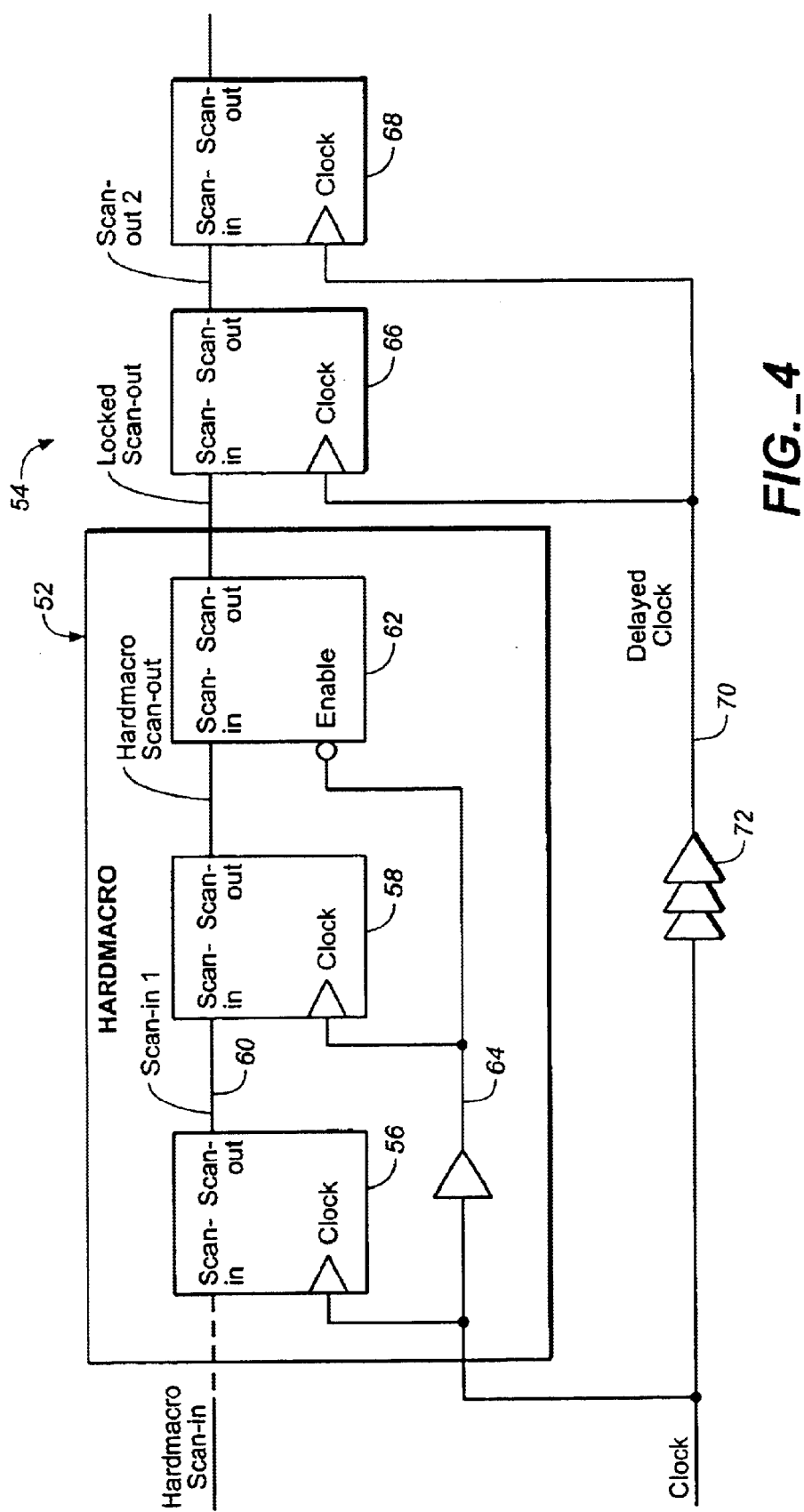
FIG._4

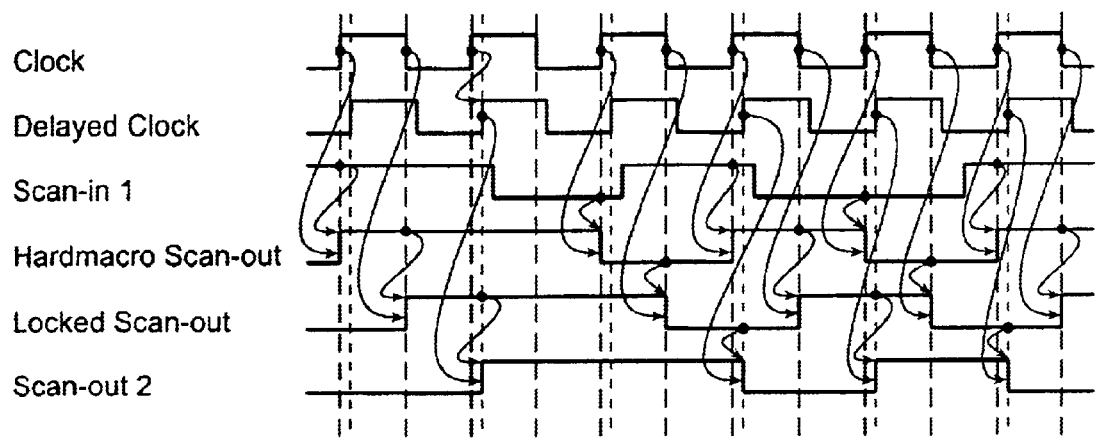
FIG._5
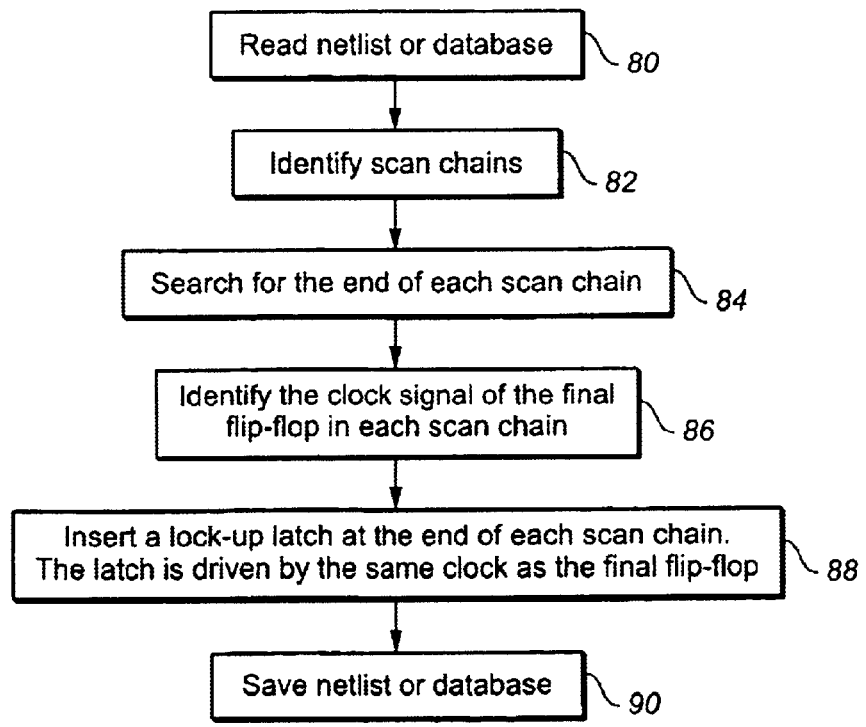
FIG._6

SCAN CHAIN TESTING OF INTEGRATED CIRCUITS WITH HARD-CORES

FIELD OF THE INVENTION

This invention relates to scan chain testing of integrated circuits, in particular, circuits containing at least one hard-core. The invention is especially suitable for application specific integrated circuits (ASICs), but it is not limited exclusively to ASICs.

A core is a circuit around which other parts of the integrated circuit are designed, and a typical core may be, for example, a processor. A hard-core is a core circuit which is fixed in design and layout independently of any other "peripheral" circuits to be integrated with the core. The peripheral circuits have to be specifically designed to operate with the core; no changes to the hard-core are possible.

BACKGROUND TO THE INVENTION

Hard-cores are often used in ASICs. The hard-core provides guaranteed functionality, such as signal processing. By preventing any changes to the core circuit, the operation of the core will always be the same. The peripheral circuits can be designed to interact with the core to provide the application specific functionality. The precise design of the core is supplied as a "hardmacro" (e.g. a fixed physical circuit layout including a fixed netlist), which can be combined with designs of the peripheral circuits from a different designer. The functionality of the combined circuit design can be synthesised and tested before the circuit is physically manufactured. However, it is not possible to alter any part of the hardmacro.

When testing integrated circuits after manufacture, a known common approach is socalled scan chain testing. In addition to normal circuit paths, the internal registers (flip-flops) in the integrated circuit can be coupled in a test mode to form a serial scan chain path. Data can be clocked into, or out from, the registers on the scan chain path, which act as a single shift register. For scan chain testing, a hardmacro typically has a scan chain line which can be coupled to a corresponding scan-chain path of the peripheral circuits outside the core.

The scan chain is very sensitive to clock-skew between the clock signals applied to the different registers in the scan chain, as this can easily cause a hold-time violation in one or more receiving registers. The sensitivity to skew is magnified with a hardmacro core (or a hard-core), since the clock signals for the peripheral circuits are routed along completely different clock paths (or branched clock trees) outside the core, compared to the clock signals routed inside the core. This problem is illustrated in FIGS. 1 and 2. In FIG. 1, an example first register 10 is illustrated inside a hardmacro core 12, which can be coupled on a scan chain path 14 to a second register 16 in a peripheral circuit outside the core 12. Although both registers 10 and 14 are clocked from the same source 18, the clock signal to the first register 10 is routed on a first clock path 20 within the core 12, and the clock signal to the second register 16 is routed on a completely different clock path 22 outside the core 12 which may be delayed with respect to the internal clock path.

FIG. 2 shows the relationship between the outputs of the registers 10 and 16 when clocked with the respective clock signals. In FIG. 2, the arrows show how the edges of the clock pulses trigger the outputs from the registers with respect to their inputs. For the first register 10 it can be seen that the output (Hardmacro scan-out) effectively lags the input (Scan-in) by almost a complete clock cycle, such that the first register is acting properly as a shift stage in the scan chain. However, the delayed clock to the second register 16 causes a hold-time violation, so that the second register does not capture the previous signal from the first register 10 before the first register output changes; instead it incorrectly captures the output (Hardmacro scan-out) from the first register 10 after the signal from the first register 10 has changed. Therefore, the second register 16 does not act properly as a shift stage, and causes data to be lost in the scan chain.

The above discussion has simplified the problems of applying clock signals in the scan chain. The problem is further worsened in practice because the clock signal paths are usually complicated branched tree paths. Moreover, the clock signal path used during scan chain inputting/outputting is usually different from the clock signal path used during normal operation of the integrated circuit. The test clock paths are only used during initial testing. More effort is therefore devoted to the routing of the normal clock path, as a balanced tree path, to try to control the skew during normal operation of the integrated circuit. In fact, clock skew is inevitable even in the normal clock path, due to noise and to manufacturing tolerances. Since it is impractical to devote as much effort to the routing of the test clock paths (since these are not used during normal chip operation), the degree of clock skew in the test clock paths can be significantly worse.

Design tools are available which can design circuitry to accommodate clock skew between first and second circuit domains provided that the clock skew between the domains is known. The design tools insert a latch in the output of the first domain to act as a buffer for the scan chain signal as it passes from the first domain to the second domain. The latch is clocked by the clock from the first domain, to avoid hold-time violations from the clock of the second domain. Examples of such circuit design tools include FastScan and DFT Advisor from Mentor Graphics Corporation of Wilsonville, Oreg., and Tetramax from Synopsys Corporation of Mountain View, Calif. However, such design tools require the clocks of both the first and second circuit domains to be known, and to be precisely defined, in order to determine whether a latch is appropriate. Such precise information is not always available for hardmacros. An additional problem with such a design tools is that, at the time of designing the peripheral circuit, the design of the hardmacro is already fixed as a pre-released and certified design which cannot be altered. Therefore, the design tool has no way of modifying the hardmacro in the manner described above, and would therefore fail to link the peripheral circuit and the hardmacro in a way that would accommodate clock skew between the circuits. (In fact, the conventional design tool would attempt to include a lock-up latch outside the core, driven by the only clock signal available, namely the skewed clock signal in the peripheral circuit. The latch would then suffer from the same timing problems as those explained above for FIG. 2).

In the absence of any reliable technique for detecting and addressing scan chain timing problems between a fixed hardmacro and a peripheral circuit during the design stage, such timing problems are often only appreciated after the circuit has been physically manufactured. This leads to additional costs and delays while the problem is investigated and resolved by engineers manually. This problem is made worse in practice because the peripheral circuits are designed by different engineers (and different companies) from the original core designers.

Therefore, the technical problem underlying the invention arises from the two-part manner in which hard-core circuits are designed. The core designer is only concerned with the functioning of the core, and not with timing compatibility with peripheral circuits. Ensuring timing compatibility (and all compatibility) is the problem for the designer of the peripheral circuits after the core has been designed and released. However, the designer of the peripheral circuits is dealing with a pre-designed hard-core circuit, and cannot make any changes to the core. He can only design around the core.

SUMMARY OF THE INVENTION

In one aspect, the invention relates to an integrated circuit including a hard-core and a peripheral circuit. The hard-core includes a first plurality of registers, a first clock path and a latch. The first plurality of registers is couplable by a first scan chain path from a first to a last of the first plurality of registers. The first clock path is configured to supply a test clock to the first plurality of registers to clock data along the first scan chain path. The latch has an input coupled to an output of the last register in the first scan chain path and an output providing an output of the first scan chain path. The latch is coupled to the first clock path. The peripheral circuit is coupled to the hard-core circuit, and includes a second plurality of registers and a second clock path. The second plurality of registers is couplable by a second scan chain path from a first to a last of the second plurality of registers. The second clock path is configured to supply the test clock to the second plurality of registers to clock data along said second chain path. The output of the first scan chain path from the latch is coupled to an input of the second scan chain path.

Other aspects relate to a digital storage medium carrying a representation of a hardmacro; a method of designing a circuit module for an integrated circuit; and a computer running a design program for a circuit module for an integrated circuit.

A principal advantage of the invention is the avoidance of timing problems relating to clock skew in the independent clock paths for the scan chain path in the hard-core and the scan chain path in the peripheral circuit.

BRIEF DESCRIPTION OF THE DRAWINGS

Further features, objects and advantages of the invention will be appreciated from the following non-limiting description of preferred embodiments of the invention, with reference to the accompanying drawings, in which:

FIG. 1 is a schematic block diagram of a scan chain technique in a conventional ASIC;

FIG. 2 is a schematic timing diagram showing the signal timing in the conventional circuit of FIG. 1;

FIG. 3 is a schematic block diagram of an ASIC in accordance with an embodiment of the present invention;

FIG. 4 is a schematic block diagram of the scan-chain technique in the ASIC of FIG. 3;

FIG. 5 is a schematic block diagram showing the signal timing in the circuit of FIG. 4; and FIG. 6 is a schematic flow diagram for the operation of a design tool in a second embodiment.

DETAILED DESCRIPTION OF PREFERRED EMBODIMENTS

Referring to FIG. 3, an ASIC 50 comprises a hard-core circuit 52, which may be a signal processor, and a peripheral circuit 54 to provide the ASIC with specific, dedicated functionality. In the following, the circuit is described as hardware; however, a person skilled in the art will appreciate that the same principles apply to the circuit design, for example defined by a netlist or by other hardware description data.

Referring to FIG. 4, the core 52 includes registers (a first plurality of registers or flip-flops), which can be coupled in a test mode to perform scan chain testing. The core may typically include thousands (or tens or hundreds of thousands) of registers; only two core registers 56 and 58 are shown in FIG. 3 for the sake of brevity. Also, FIG. 4 only shows the functional connection between the registers 56 and 58 for the test mode; it does not depict any functional connection which may exist during the normal operating mode of the circuit, as this is not important for understanding the invention. It will be appreciated that in the normal operating mode the two registers may be coupled completely differently, and perhaps not at all.

In the test mode, the output from the first register 56 is coupled to the input of the second register 58 to form a scan chain path 60 (first scan chain path). The output from the second register 58 (which is the last core register in the scan chain path 60) is coupled to the input of a lock-up latch 62 for forming an interface for the scan chain path 60 outside the core 52. The first and second registers 56 and 58, and the lock-up latch 62, are driven by a clock signal supplied via an "internal" (first) clock signal path 64. A significant detail is that there should be no, or little, skew between the clock signals applied to the second register 58 and the lock-up latch 62. It is preferred that these devices be driven by the same clock signal, and in the preferred embodiment, the latch 62 is coupled directly to the clock signal applied to the second register 58.

The peripheral circuit 54 also includes registers (second plurality of registers or flip-flops that can be coupled in series to form a scan chain path. The peripheral circuit may also include thousands (or tens or hundreds of thousands) of registers; only two peripheral circuit registers and are shown in FIG. 4 for the sake of brevity, being a third register 66 and a fourth register 68. In the test mode, the third register 66 is coupled to the scan chain path 60 from the core, and in particular is coupled to the output from the lock-up latch 62. Likewise, in the test mode, the fourth register 68 is coupled to the output of the third register 66 to form a continuation of the scan chain path 60 (second scan chain path). The third and fourth registers 66 and 68 are driven from an "external clock" signal path (second clock path) 70 outside the core 52. It will be appreciated that the different signal paths 64 and 70 will generally result in skew between the two clock signals, represented by extra "delays" 72 in the external path 70 around the core 52. It will also be appreciated that FIG. 4 only depicts the clock signal paths for the test mode of the circuit 50; different clock signal paths will typically used for the normal operating mode of the circuit, which may be designed with less clock skew. However, it is difficult and impractical to design the test clock signal paths 64 and 72 with no or little clock skew, particularly when the test mode will typically never be used during normal operation of the ASIC 50.

FIG. 5 illustrates the signal timing for the circuit of FIG. 4, and the effect of the lock up latch on the data transfer from the second register 58 to the third register 66. It is useful to compare FIG. 5 with FIG. 2. In FIG. 5, the arrows show how the edges of the clock pulses trigger the outputs from the registers with respect to their inputs. In a similar manner to FIG. 2, it can be seen that the second register 58 is clocked by the rising edges of the clock signal. The output from the second register 58 (Hardmacro scan-out) effectively lags the input (Scan-in) by almost a complete clock cycle, such that the second register 58 is acting properly as a shift stage in the scan chain. The lock-up latch 62 is clocked by the falling edge of the clock signal (indicated by its inverting clock input), so that the lock-up latch 62 captures the output state from the second register 58 (indicated by arrows 74), and holds this state at the scan chain output for an extra half-cycle. The third register 66 is thus able to accept the scan chain data even though the third register 66 is clocked by the delayed clock. As can be seen in FIG. 5, the output from the third register 66 (Scan-out 2) lags the output from the second register 58 (Hardmacro scan-out) by almost a complete clock cycle. The third register 66 can therefore act correctly as a shift stage, despite the delayed clock.

Thus the provision of the lock-up latch 62 at the end of the scan chain path 60 in the hard-core 52 (or the hardmacro) avoids any timing problems which can commonly occur caused by clock skew between the test clock paths in the hard-core and the peripheral circuits integrated therewith. Even if the lock-up latch 62 is not essential for a particular peripheral circuit, its inclusion does not create any problems, since it is clocked by an opposite clock edge to the registers (e.g. it is clocked by the falling edge, whereas the registers are clocked by the rising edge). Therefore, the lock-up latch 62 does not interfere with the shifting of the data during clocking of the scan chain path; it merely preserves the data for an extra half cycle to accommodate clock skew for a following register. The above description has assumed that there is a single scan chain in the hard core 52. However, it will be appreciated that the core may contain two or more scan chain paths, and a separate lock-up latch 62 may be added to each scan chain path.

FIG. 6 illustrates a flow diagram for an automated design tool for automatically implementing such a lock-up latch 62 at the end of the of the scan chain path when designing a hardmacro 52, in contrast to current design tools. The method of FIG. 6 includes a first step 80 of reading the circuit details from a netlist or database. At step 82, the scan chain paths are identified for the core. At step 84, the (output) end of each scan chain is identified, and at step 86, the clock signal path is identified for the final register (flip-flop) in the scan chain path. At step 88, the lock-up latch 62 is inserted at the end of the scan chain path, and the latch 62 is coupled so as to be driven by the same clock as the final register preceding the latch 62. Finally, at step 90, the circuit data is re-saved.

It will be appreciated that the automated design tool and method are not limited only to the designing of hardmacros. They may be applied to any module for an integrated circuit in which it is desired to include a lock-up latch at the end of the scan chain test path, even when the clock state of a following circuit is not known. This contrasts to conventional design tools which do not include such an automated facility unless the precise clock timing of any following timing is defined.

The resulting design of hardmacro or other module may be stored in any suitable digital storage medium, for example, digital memory or mass storage, or using a portable data carrier, such as a magnetic or optical disc.

It will be appreciated that the foregoing description is merely illustrative of preferred forms of the invention, and that many modifications, improvements and equivalents may be used within the scope of the invention. Accordingly, the following claims are intended to be broadly construed to include all such modifications, improvements and equivalents.

What is claimed is:

1. An integrated circuit comprising:
 a hard-core circuit comprising:
 a first plurality of registers, said registers configured as a first scan chain path from a first to a last of said first plurality of registers;
 a first clock path configured to supply a test clock to each of said first plurality of registers to clock data along said first scan chain path;
 a latch having (i) an input coupled to an output of said last register and (ii) an output providing an output of said first said scan chain path, said latch being coupled to said first clock path;
 a peripheral circuit coupled to said hard-core circuit, wherein said output of said first scan chain path from said latch is coupled to an input of said peripheral circuit.

2. The integrated circuit according to claim 1, wherein said integrated circuit comprises an application specific integrated circuit.

3. The integrated circuit according to claim 1, wherein said test clock signal has the same skew presented to said latch and said last register.

4. The integrated circuit according to claim 3, wherein said latch is (i) directly coupled to said last register of said first plurality of registers and (ii) configured to receive substantially the same clock signal as said last register.

5. The integrated circuit according to claim 1, wherein said peripheral circuit comprises:
 a peripheral circuit coupled to said hard-core circuit, said peripheral circuit comprising:
 a second plurality of registers, said registers being couplable by a second scan chain path from a first to a last of said second plurality of registers; and
 a second clock path configured to supply said test clock to said second plurality of registers to clock data along said second chain path.

6. The integrated circuit according to claim 5, wherein (i) said first clock path introduces a first clock skew along said first clock path, (ii) said second clock path introduces a second clock signal skew along said second clock path, and (iii) said second clock skew is different from said first clock skew.

7. The integrated circuit according to claim 5, wherein (i) said first and second plurality of registers are clocked by a first type of clock pulse edge in said clock signal, and (ii) said latch is clocked by a second type of clock pulse edge in said clock pulse signal.

8. The integrated circuit according to claim 1, wherein said first clock path is coupled to an enable input of said latch.

9. The integrated circuit according to claim 1, wherein each of said shift register and said latch are directly connected to said first scan chain.

10. A digital storage medium storing a representation of a hardmacro for a hard-core of an integrated circuit, said hardmacro defining a circuit having a fixed design and comprising:
 a plurality of registers couplable by a first scan chain path from a first to a last of said registers;
 a clock path configured to supply a test clock signal to each of said registers to clock test data along said scan chain path;
 a latch having (i) an input coupled to said last register and (ii) an output providing a scan chain path output from said hardmacro, wherein said latch is coupled to said clock path.

11. The medium according to claim 10, wherein said latch is coupled to said clock path so as to receive a clock signal having the same signal skew as the clock signal supplied to said last register.

12. The medium according to claim 11, wherein said latch is directly coupled to said last register so as to receive the same clock signal as said last register.

13. The medium according to claim 10, wherein the medium is a digital memory.

14. The medium according to claim 10, wherein the medium is a portable data carrier.

15. The medium according to claim 10, wherein the medium further stores a peripheral circuit coupled to said hardmacro, said peripheral circuit comprising:

a second plurality of registers couplable by a second scan chain path from a first to a last of said second plurality of registers; and a second clock path outside said hardmacro configured to supply said test clock signal to said second plurality of registers for clocking test data along said second scan chain path, wherein said output of said first scan chain path from said latch is coupled to an input of said second scan chain path.

16. A method of creating a representation of a first circuit module of an integrated circuit, the first circuit module having an interface configured to be coupled to a second circuit module, and the design of the first circuit module being independent of the second circuit module, the first circuit module comprising a plurality of registers couplable by a scan chain path from a first to a last of said registers, and a clock signal path configured to supply a test clock signal to each of said registers to clock test data along said scan chain path; wherein said method comprises the steps of:

(A) identifying said last latch in said scan chain path;

(B) inserting a latch in said circuit module, said latch having an input coupled to said last register in said scan chain path, and an output providing a scan chain output from said circuit module to said interface; and (C) coupling said latch to said clock to be driven by a clock signal having substantially the same signal skew as that applied to said last register.

17. The method according to claim 16, wherein said step (C) comprises:

directly coupling said latch to said last register so as to receive the same test clock signal as said register.

18. The method according to claim 16, wherein (i) said registers are of a type clocked by a first type of clock pulse edge in said test clock signal, and (ii) said latch is of a type clocked by a second type of clock pulse edge in said test clock signal.

19. The method according to claim 16, wherein said first circuit module comprises a hard-core.

20. A computer running a design program for designing a circuit module of an integrated circuit independently of the design of other circuit modules, the first circuit module comprising an interface configured to be coupled to a second circuit module, a plurality of registers couplable by a scan chain path from a first to a last of said registers, and a clock signal path configured to supply a test clock signal to each of said registers to clock test data along said scan chain path, said method design program is operable to automatically perform the steps of:

(A) identifying said last latch in said scan chain path;

(B) inserting a latch in said circuit module, said latch having an (i) input coupled to said last register in said scan chain path (ii) and an output providing a scan chain output from said circuit module to said interface; and (C) coupling said latch to said clock to be driven by a clock signal having substantially the same signal skew as that applied to said last register.

* * * * *